US010107227B2

(12) United States Patent
Qin

(10) Patent No.: US 10,107,227 B2
(45) Date of Patent: Oct. 23, 2018

(54) METHOD OF FORMING A CYLINDER LINER

(71) Applicant: ZYNP International Corp., Romulus, MI (US)

(72) Inventor: Xiaocai Qin, Romulus, MI (US)

(73) Assignee: ZYNP INTERNATIONAL CORP., Romulus, MI (US)

( * ) Notice: Subject to any disclaimer, the term of this patent is extended or adjusted under 35 U.S.C. 154(b) by 43 days.

(21) Appl. No.: 15/403,235

(22) Filed: Jan. 11, 2017

(65) Prior Publication Data

US 2017/0122247 A1 May 4, 2017

Related U.S. Application Data

(62) Division of application No. 14/608,164, filed on Jan. 28, 2015, now Pat. No. 9,581,103.

(60) Provisional application No. 61/932,583, filed on Jan. 28, 2014.

(51) Int. Cl.

| | |
|---|---|
| ***F02F 1/00*** | (2006.01) |
| ***C21D 1/19*** | (2006.01) |
| ***C21D 9/08*** | (2006.01) |
| ***C22C 38/00*** | (2006.01) |
| ***C22C 38/02*** | (2006.01) |
| ***C22C 38/04*** | (2006.01) |
| ***C22C 38/08*** | (2006.01) |
| ***C22C 38/12*** | (2006.01) |
| ***C22C 38/16*** | (2006.01) |
| ***B24B 33/02*** | (2006.01) |

(52) U.S. Cl.

CPC .............. *F02F 1/004* (2013.01); *B24B 33/02* (2013.01); *C21D 1/19* (2013.01); *C21D 9/08* (2013.01); *C22C 38/002* (2013.01); *C22C 38/02* (2013.01); *C22C 38/04* (2013.01); *C22C 38/08* (2013.01); *C22C 38/12* (2013.01); *C22C 38/16* (2013.01); *H05K 999/00* (2013.01); *F02F 2200/00* (2013.01)

(58) Field of Classification Search

CPC ........ F02F 1/004; F02F 2200/00; B24B 33/02
USPC ........................................ 123/193.2, 888.061
See application file for complete search history.

(56) References Cited

U.S. PATENT DOCUMENTS

| | | | | | |
|---|---|---|---|---|---|
| 5,701,861 | A * | 12/1997 | Hegemier | B24B 33/02 123/193.2 | |
| 5,960,762 | A | 10/1999 | Imai | | |
| 6,318,330 | B1 | 11/2001 | Kestner et al. | | |
| 6,732,698 | B1 | 5/2004 | Bedwell et al. | | |
| 7,059,290 | B2 | 6/2006 | Ishikawa | | |

(Continued)

FOREIGN PATENT DOCUMENTS

| | | | |
|---|---|---|---|
| BR | PI9704066-5 | A | 12/1998 |
| DE | 19629970 | C1 | 3/1998 |

(Continued)

*Primary Examiner* — Marguerite McMahon
(74) *Attorney, Agent, or Firm* — Michael E. Dockins; Shumaker, Loop & Kendrick, LLP

(57) ABSTRACT

A cylinder liner is disclosed, the cylinder liner having a smoother internal surface of an internal side than known cylinder liners. The internal surface having at least one of a reduced peak height of (Rpk) of ≤0.25 μm, a core roughness (Rk) of about 0.2 μm to about 0.6 μm, a reduced valley depth (Rvk) of about 1.2 μm to about 2.5 μm, a material ratio (Mr1) of ≤10%, and a material ratio (Mr2) of about 70% to about 90%.

10 Claims, 3 Drawing Sheets

(56) References Cited

U.S. PATENT DOCUMENTS

| | | | | |
|---|---|---|---|---|
| 8,381,695 | B2 * | 2/2013 | Klink | B23H 9/008 123/193.1 |
| 2005/0235944 | A1 * | 10/2005 | Michioka | C23C 4/02 123/193.2 |
| 2007/0101967 | A1 | 5/2007 | Pegg | |
| 2007/0234994 | A1 | 10/2007 | Wang | |
| 2010/0253006 | A1 | 10/2010 | Ishikawa | |
| 2010/0326619 | A1 | 12/2010 | Kim | |
| 2015/0011444 | A1 | 1/2015 | Ramm | |

FOREIGN PATENT DOCUMENTS

| | | | |
|---|---|---|---|
| EP | 0525540 | B1 | 2/1993 |
| WO | 2013026124 | A1 | 2/2013 |

* cited by examiner

METHOD OF FORMING A CYLINDER LINER

CROSS-REFERENCE TO RELATED APPLICATION

This application is a divisional application of and claims the benefit of priority of U.S. patent application Ser. No. 14/608,164 which claims the benefit of priority of U.S. Provisional Patent Application Ser. No. 61/932,583 filed on Jan. 28, 2014 each of which is hereby incorporated herein by reference in its entirety.

FIELD OF THE INVENTION

The present invention relates to cylinder liners and, more particularly, to a cylinder liner for internal diesel combustion engines and methods for processing of the same.

BACKGROUND OF THE INVENTION

Oil bearing surfaces such as typically found in cylinders or cylinder liners of internal combustion engines, or piston-cylinder assemblies, commonly called linear actuators, have special material surfaces. These surfaces have a special topography and are usually formed first by a rough hone and then a finish hone both rough and finish hones are "stones" mounted in a honing machine head which rotates and axially translates the stones within the cylindrical bore of the surface. Both rough and finish hones are usually mounted in the same honing machine head and the operations take place sequentially at the same location. Also used in the rough and finish operations are steel holders with abrasive minerals plated thereon. In either case the tool is rigid and presents in the operation an unyielding abrasive-work interface.

The resultant surface has folded over peaks, folded over metal and debris in the bottom of the cross hatching oil grooves. This is true even though the surface is constantly flushed with lubricant or coolant during the honing operations.

In operation, the rough honing tools which contain a coarse abrasive grit are pressed against the cylinder walls to perform the work required. After a predetermined time cycle the rough honing tools are retracted into the honing head and the finish honing tools, containing a very fine abrasive grit, are pressed against the cylinder walls during the final finishing operation.

The rough hone forms in the surface a pattern of ridges and grooves, almost like a cross hatch pattern. These grooves or striations are the oil retention pattern against which the piston or piston rings ride. Unfortunately when the rough hone operation is completed the surface greatly enlarged shows deep peaks and valleys or other sharp projections which can break off, and which would contribute to piston or ring wear, and all of the detrimental performance, life and environmental problems associated therewith. For example, ring or piston wear is the cause of "blow by" which can create all kinds of emission problems in an internal combustion engine. The purpose of the finish hone is to smooth over the peaks and valleys.

It has been discovered that rigid finish hones, while somewhat improving the topography of the surface, can in many instances actually contaminate the surface by driving or embedding dislodged hard abrasive particles into the surface. This has been determined by photomicrographs and by tests of engines and engine oil after break in. The particle is usually driven into the slope or crown of a ridge which is the seal bearing surface. Thus, instead of the surface being improved, it has been made worse. A projecting hard abrasive particle will score a piston ring or seal causing premature failure, blow by, and poor engine efficiency, for example, and most of the other problems honing is supposed to address.

It would be desirable to develop a cylinder liner that generates less friction during use thereby resulting in improved fuel consumption and emission.

SUMMARY OF THE INVENTION

Concordant and congruous with the present invention, a cylinder liner that generates less friction during use thereby resulting in improved fuel consumption and emission has surprisingly been discovered.

According to an embodiment of the invention, a cylinder liner comprises an internal sidewall having an internal surface with a reduced peak height of (Rpk) of ≤0.25 μm.

According to another embodiment of the invention, A cylinder liner comprises an external sidewall having an external surface; and an internal sidewall having an internal surface consisting essentially of a reduced peak height of (Rpk) of ≤0.25 μm, a core roughness (Rk) of about 0.2 μm to about 0.6 μm, a reduced valley depth (Rvk) of about 1.2 μm to about 2.5 μm, a material ratio (Mr1) by an intersecting line which separates the protruding peaks from the roughness core profile in a roughness analysis of ≤10%, and a material ratio (Mr2) determined by an intersecting line which separates the valleys from the roughness core profile in a roughness analysis of about 70% to about 90%.

According to another embodiment of the invention, a process for forming a cylinder liner comprises the steps of: providing a formed cylinder liner having an internal sidewall with an internal surface having a roughness; rough honing the internal surface of the cylinder liner so that the internal surface has a roughness less than the roughness of the formed cylinder liner; finish honing the internal surface of the cylinder liner so that the internal surface has a roughness less than the roughness of the rough honed cylinder liner; honing the internal surface of the cylinder liner so that the internal surface has a roughness less than the roughness of the finish honed cylinder liner.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which.

DETAILED DESCRIPTION OF EXEMPLARY EMBODIMENTS OF THE INVENTION

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical. It is further understood that the methods disclosed herein may be employed together or separately to form a cylinder liner.

Figure 1:
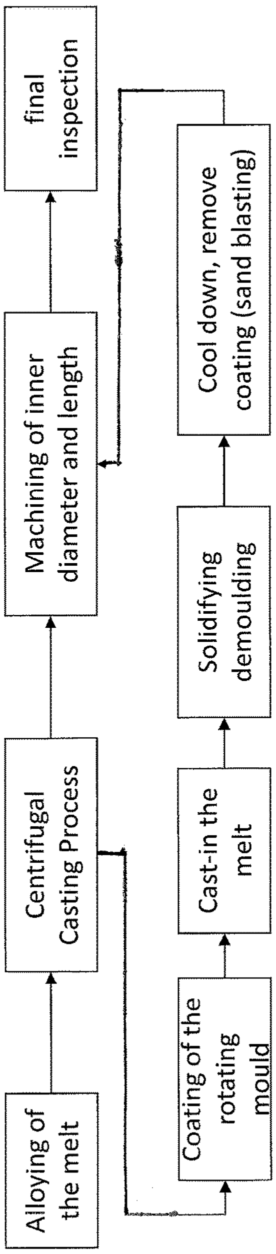
FIG. 1 is a flow diagram of a cylinder liner manufacturing process as known in the art.

A cylinder liner is formed for use in a diesel engine. The cylinder liner may be formed by known methods (FIG. 1) or by using the following process for forming a cylinder liner:

1. A mold is set up and rotated along a horizontal (1000-1700 rpm) axis.
2. The mold is coated with a refractory coating.
3. While rotating, molten metal having a desired composition is poured in.
4. The metal that is poured in will distribute itself over the rotating wall.
5. During cooling lower density impurities will tend to rise towards the center of rotation.
6. After the part has solidified, it is removed and machine finished.

Figure 2:
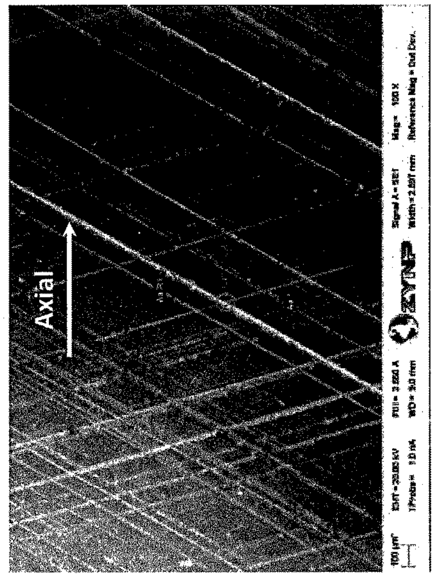
FIG. 2 is a photograph of a finished cylinder liner at 200× magnification formed using a method according to an embodiment of the invention.
Figure 11:
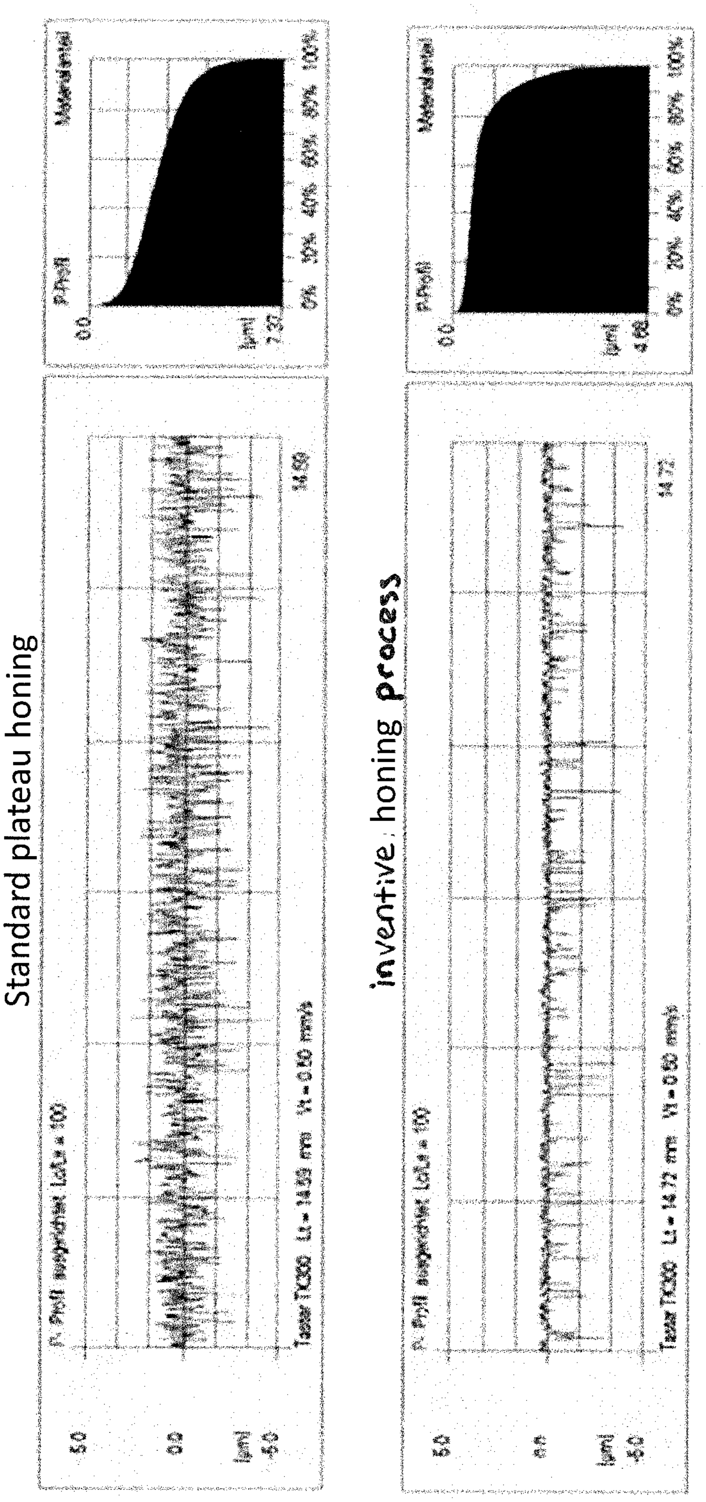
FIG. 11 is a comparison of roughness analysis graphs of the process according to an embodiment of the invention and a standard plateau honing process.

The formed liner may be formed from iron, steel, a steel alloy, or another metal or metal alloy, as desired. The formed liner is then machine finished using a process according to an embodiment of the invention to form a finished cylinder liner according to another embodiment of the invention. The finished cylinder liner has a smooth roughness structure to improve the high load capacity, which means the ability to transfer the load supported by the asperities to oil film through a high percentage contact area, low roughness surface finishing and narrow and deep valleys for adhesion of lubricant. The finished cylinder liner has an external surface in an external sidewall and an internal surface of an internal sidewall formed by invention has a pattern shown in FIG. 2. The pattern may be described as a cross hatch pattern. A roughness analysis of the internal surface of the internal sidewall machined according to the inventive honing process is shown in FIG. 11.

Figure 3:
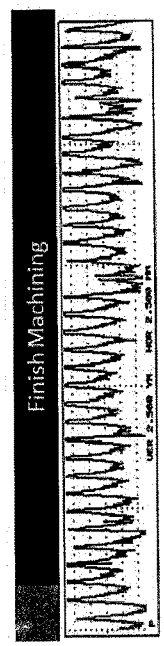
FIG. 3 is a roughness analysis graph of an as-cast cylinder liner.
Figure 4:
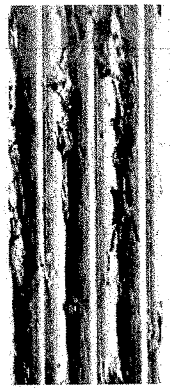
FIG. 4 is a magnified photograph of the cylinder liner of FIG. 3.
Figure 5:
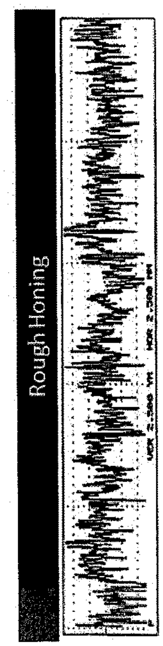
FIG. 5 is a roughness analysis graph of the cylinder liner of FIG. 3 after a rough honing process.
Figure 6:
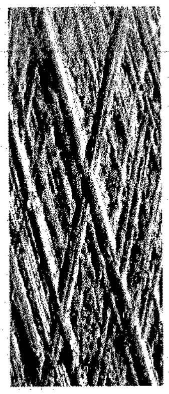
FIG. 6 is a magnified photograph of the cylinder liner of FIG. 5.
Figure 7:
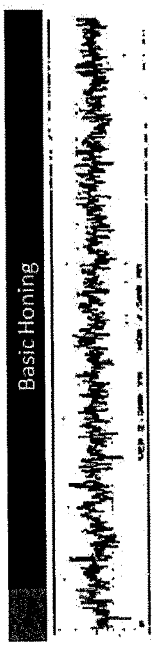
FIG. 7 is a roughness analysis graph of the cylinder liner of FIG. 5 after a finish honing process.
Figure 8:
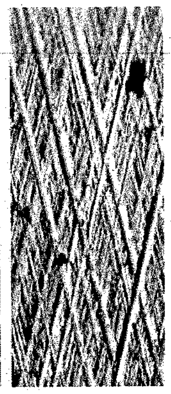
FIG. 8 is a magnified photograph of the cylinder liner of FIG. 7.

An as-cast cylinder liner or a cylinder having been machine finished or honed with a rough surface (particularly) as compared to the subsequent honing steps described hereinbelow is provided. A roughness analysis of the cylinder liner is shown in FIG. 3, and a magnified photograph of the cylinder liner surface is shown in FIG. 4. The as-cast cylinder liner or a machine finished cylinder liner is placed into a rough honing tool containing a coarse abrasive grit that is pressed against the cylinder walls to perform the work required. The rough hone forms in the surface a pattern of ridges and grooves, almost like a cross hatch pattern. A roughness analysis of the rough honed cylinder liner is shown in FIG. 5, and a magnified photograph of the cylinder liner surface is shown in FIG. 6. These grooves or striations are the oil retention pattern against which the piston or piston rings ride. Unfortunately when the rough hone operation is completed the surface greatly enlarged shows deep peaks and valleys or other sharp projections which can break off, and which would contribute to piston or ring wear, and all of the detrimental performance, life and environmental problems associated therewith. For example, ring or piston wear is the cause of "blow by" which can create all kinds of emission problems in an internal combustion engine. Accordingly, a finishing hone (which may be referred to as a basic honing) is completed. The purpose of the finish hone is to smooth over the peaks and valleys. A roughness analysis of the finish honed cylinder liner is shown in FIG. 7, and a magnified photograph of the cylinder liner surface is shown in FIG. 8. After a predetermined time cycle, the rough honing tools is retracted into the honing head and a finish honing tool, containing a fine abrasive grit, is pressed against the cylinder walls during the finishing honing operation. The honing angle of the fourth honing step is about 40° to about 60°, and more specifically may be about 60°±4°.

Figure 9:
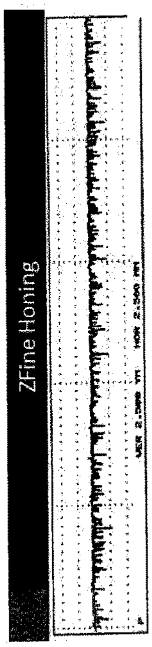
FIG. 9 is a roughness analysis graph of the cylinder liner of FIG. 7 after a fourth honing process according to an embodiment of the invention.
Figure 10:
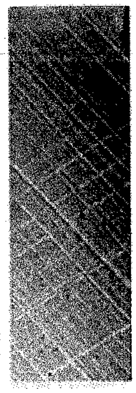
FIG. 10 is a magnified photograph of the cylinder liner of FIG. 9.

After the finish machining, rough honing, and finish/basic honing steps, a fourth step using an ultra-fine abrasive grit is pressed against the cylinder walls. A roughness analysis of the cylinder liner after the fourth step is shown in FIG. 9, and a magnified photograph of the cylinder liner internal surface is shown in FIG. 10. The surface finishing steps of the intention are performed primarily for two reasons: to decrease the break-in period for cylinders so that the engine may reach a stable running condition and to generate adequate oil pockets to achieve a desirable tribological condition(s). Upon completion of the fourth step, the internal surface of the finished cylinder liner has at least one of the following specifications, but the cylinder liner may have any combination of the following specifications or all of the specifications, as desired:

A reduced peak height (Rpk) of ≤0.25 μm. The Rpk defined as the average height of the protruding peaks above the roughness core profile.

A core roughness (Rk) of about 0.2 μm to about 0.6 μm. The Rk defined as the depth of the roughness core profile.

A reduced valley depth (Rvk) of about 1.2 μm to about 2.5 μm. The Rvk defined as the average depth of the profile valleys projecting through the roughness core profile.

A material ratio (Mr1) defined in percentages of ≤10%. The material ratio Mr1 determined by an intersecting line which separates the protruding peaks from the roughness core profile in a roughness analysis.

A material ratio (Mr2) defined in percentages of about 70% to about 90%. The material ratio Mr1 determined by an intersecting line which separates the valleys from the roughness core profile in a roughness analysis.

The specifications noted above, Rpk, Rk, Rvk, Mr1, and Mr2 are improved measurement methods described in ISO13565-1/-2/-3 hereby incorporated herein by reference in their entirety.

The cylinder liner formed using the process described hereinabove and having the specifications described herein is superior to cylinder liners known in the art and, more specifically, to cylinder liners finished using a plateau honing process, because the cylinder liner has fewer asperity peaks with shallower and more dense and uniform groove valleys. Because the cylinder liner has a lower Rpk (about 400% lower than a plateau honed liner), the cylinder liner has less run-in wear and a thinner oil film. Because the cylinder liner has a lower Rk (about 300% lower than a plateau honed liner), the cylinder liner has a more uniform oil thickness and distribution during use in an engine. Because the cylinder liner has a lower Rvk (about 200% lower than a plateau honed liner), the cylinder liner has deeper and narrower grooves resulting in better oil adhesion. During use cylinder liners formed using the process of the invention have lower hydrodynamic drag for high speeds (mid-stroke region) for low viscosity oils, and lower boundary friction (lower peak heights) avoiding metal-on-metal contact during low engine speeds.

A comparison of roughness analysis graphs of a cylinder liner machined using a plateau honing process and the four-step honing process according to the present invention is shown in FIG. 11.

Inspection of the finished cylinder liner machined per the four-step process noted above results was conducted pursuant to the following:

Lc (Cut off Length): 2.5 mm

Lt (Traverse Length): 12.5 mm

Measurement Length: 15 mm

Vt (Speed of stylus): 0.5 mm/s

Radius of Stylus: 5 μm

Below is a chart comparing roughness structure per ISO 13565-2 for the present invention versus known honing methods:

| Parameter | Present Invention | Slide Honing | Spiral Honing | Plateau Honing | Brush Honing |
|---|---|---|---|---|---|
| Rpk | ≤0.25 μm | ≤0.30 μm | ≤0.30 μm | ≤1.0 μm | ≤1.20 μm |
| Rk | about 0.2 μm-about 0.6 μm | 0.3 μm-0.8 μm | 0.3 μm-0.8 μm | 1.0 μm-2.4 μm | 0.4 μm-2.0 μm |
| Rvk | about 1.2 μm-about 2.8 μm | 1.5 μm-2.5 μm | 1.5 μm-2.5 μm | 1.6 μm-3.8 μm | 1.3 μm-2.5 μm |
| Mr1 | <10% | <10% | <10% | <10% | <10% |
| Mr2 | 70%-90% | 65%-85% | 65%-85% | 65%-85% | 65%-85% |

From the foregoing description, one ordinarily skilled in the art can easily ascertain the essential characteristics of this invention and, without departing from the spirit and scope thereof, can make various changes and modifications to the invention to adapt it to various usages and conditions.

I claim:

1. A process for forming a cylinder liner comprising the steps of:

providing a formed cylinder liner having an internal sidewall with an internal surface having a roughness;

rough honing the internal surface of the cylinder liner so that the internal surface has a roughness less than the roughness of the formed cylinder liner;

finish honing the internal surface of the cylinder liner so that the internal surface has a roughness less than the roughness of the rough honed cylinder liner;

honing the internal surface of the cylinder liner so that the internal surface has a roughness less than the roughness of the finish honed cylinder liner and a reduced peak height of (Rpk) of ≤0.25 μm and a reduced valley depth (Rvk) of about 1.2 μm to about 2.5 μm, wherein wherein the cylinder liner is formed of a metal or metal alloy and the internal sidewall having the internal surface is formed of the same metal or metal alloy.

2. The process for forming a cylinder liner of claim 1, wherein the internal surface of the honed cylinder liner has a cross hatch pattern formed therein.

3. The process for forming a cylinder liner of claim 1, wherein the internal surface of the honed cylinder liner has a core roughness (Rk) of about 0.2 μm to about 0.6 μm.

4. The process for forming a cylinder liner of claim 1, wherein the internal surface of the honed cylinder liner has a material ratio (Mr1) by an intersecting line which separates the protruding peaks from the roughness core profile in a roughness analysis of ≤10%.

5. The process for forming a cylinder liner of claim 1, wherein the internal surface of the honed cylinder liner has a material ratio (Mr2) determined by an intersecting line which separates the valleys from the roughness core profile in a roughness analysis of about 70% to about 90%.

6. The process for forming a cylinder liner of claim 5, wherein the internal surface of the honed cylinder liner has a material ratio (Mr1) by an intersecting line which separates the protruding peaks from the roughness core profile in a roughness analysis of ≤10%.

7. The process for forming a cylinder liner of claim 6, wherein the internal surface of the honed cylinder liner has a material ratio (Mr2) determined by an intersecting line which separates the valleys from the roughness core profile in a roughness analysis of about 70% to about 90%.

8. The process for forming a cylinder liner of claim 7, wherein the internal sidewall has an internal surface consisting essentially of a reduced peak height of (Rpk) of ≤0.25 a core roughness (Rk) of about 0.2 μm to about 0.6 μm, a reduced valley depth (Rvk) of about 1.2 μm to about 2.5 μm, a material ratio (Mr1) by an intersecting line which separates the protruding peaks from the roughness core profile in a roughness analysis of ≤10%, and a material ratio (Mr2) determined by an intersecting line which separates the valleys from the roughness core profile in a roughness analysis of about 70% to about 90%.

9. A process for forming a cylinder liner comprising the steps of:

providing a formed cylinder liner having an external sidewall with an external surface and an internal sidewall with an internal surface having a roughness;

rough honing the internal surface of the cylinder liner so that the internal surface has a roughness less than the roughness of the formed cylinder liner;

finish honing the internal surface of the cylinder liner so that the internal surface has a roughness less than the roughness of the rough honed cylinder liner;

honing the internal surface of the cylinder liner so that the internal surface consists essentially of a reduced peak height of (Rpk) of ≤0.25 μm, a core roughness (Rk) of about 0.2 μm to about 0.6 μm, a reduced valley depth (Rvk) of about 1.2 μm to about 2.5 μm, a material ratio (Mr1) by an intersecting line which separates the protruding peaks from the roughness core profile in a roughness analysis of ≤10%, and a material ratio (Mr2) determined by an intersecting line which separates the valleys from the roughness core profile in a roughness analysis of about 70% to about 90%, wherein the cylinder liner is formed of a metal or metal alloy and the internal sidewall having the internal surface is formed of the same metal or metal alloy.

10. The process for forming a cylinder liner of claim 1, wherein the internal surface of the honed cylinder liner has a cross hatch pattern formed therein.

* * * * *